(12) United States Patent
Brugger et al.

(10) Patent No.: US 8,613,288 B2
(45) Date of Patent: Dec. 24, 2013

(54) HIGH TEMPERATURE CHUCK AND METHOD OF USING SAME

(75) Inventors: Michael Brugger, Millstatt (AT); Otto Lach, Treffen (AT)

(73) Assignee: Lam Research AG, Villach (AT)

( * ) Notice: Subject to any disclaimer, the term of this patent is extended or adjusted under 35 U.S.C. 154(b) by 725 days.

(21) Appl. No.: 12/642,101

(22) Filed: Dec. 18, 2009

(65) Prior Publication Data
US 2011/0146728 A1    Jun. 23, 2011

(51) Int. Cl.
*B08B 11/02*    (2006.01)
*B25B 11/00*    (2006.01)

(52) U.S. Cl.
USPC ............. 134/149; 134/153; 134/200; 269/55; 269/296

(58) Field of Classification Search
USPC ................. 134/149, 148, 153, 154, 157, 200; 118/53, 313
See application file for complete search history.

(56) References Cited

U.S. PATENT DOCUMENTS

| | | | |
|---|---|---|---|
| 4,903,717 A | 2/1990 | Sumnitsch | |
| 5,513,668 A | 5/1996 | Sumnitsch | |
| 5,748,434 A * | 5/1998 | Rossman et al. | 361/234 |
| 6,118,290 A * | 9/2000 | Sugiyama et al. | 324/750.22 |
| 6,536,454 B2 | 3/2003 | Lindner | |
| 6,805,338 B1 * | 10/2004 | Okuda | 269/21 |
| 2003/0172955 A1 * | 9/2003 | Kuroda et al. | 134/2 |
| 2004/0047720 A1 | 3/2004 | Lerner | |
| 2004/0070415 A1 | 4/2004 | Schneidewind et al. | |
| 2004/0203178 A1 | 10/2004 | Lee et al. | |
| 2006/0113039 A1 * | 6/2006 | Shimbara et al. | 156/345.51 |
| 2006/0156981 A1 | 7/2006 | Fondurulia et al. | |
| 2006/0160253 A1 | 7/2006 | Kim et al. | |

FOREIGN PATENT DOCUMENTS

EP    0467623 A2    1/1992
TW    200807606 A    2/2008

OTHER PUBLICATIONS

Written Opinion, dated Oct. 31, 2011, in PCT/IB2010/055551.
Written Opinion, dated Oct. 31, 2011, in PCT/IB2010/055552.
Translation of the Notification of Examination Opinions, dated Jun. 10, 2013.

* cited by examiner

*Primary Examiner* — Saeed T Chaudhry
(74) *Attorney, Agent, or Firm* — Young & Thompson

(57) ABSTRACT

Improved resistance to temperature-related degradation or deformation in a wafer-supporting chuck is provided by at least one shielding member that physically and/or thermally shields chuck components from effects of elevated temperature processing fluids.

10 Claims, 2 Drawing Sheets

HIGH TEMPERATURE CHUCK AND METHOD OF USING SAME

BACKGROUND OF THE INVENTION

The invention relates to supports for wafer-shaped articles, such as semiconductor wafers, adapted for use in elevated temperature wafer surface treatment processes.

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668, each of which is hereby expressly and entirely incorporated by reference. So-called "double-side-chucks" support a wafer in relation to treatment fluid nozzles positioned at opposing sides of the wafer, as is described in U.S. Pat. No. 6,536,454, which also is hereby expressly and entirely incorporated by reference.

Where wafer processing involves fluid and/or wafer temperatures which exceed about 80° C., the inventors have discovered that conventional chucks may suffer damage or eventual failure owing to, for example, thermal deformation of chuck components or degradation caused by contact with high temperature corrosive fluids. A chuck adapted to better withstand elevated temperature wafer processing has not previously been proposed.

SUMMARY OF THE INVENTION

The present invention concerns new chucks that are adapted for use at elevated temperatures, and methods of using them. According to the invention, a chuck for supporting an article, such as a semiconductor wafer, includes one or more shielding members that are configured and positioned to reduce degradation or deformation of chuck components due to contacting a wafer or other article with elevated temperature treatment fluids. The chucks of the invention are not limited to use in fluid processing of semiconductor wafers, but will be useful in any surface treatment process in which an article, which typically but not necessarily will be a disk, is required to be supported for contact with one or more processing fluids. While the chucks of the invention are specially adapted for elevated temperature processes, their use in processes involving temperatures of 80° C. or less also is contemplated.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
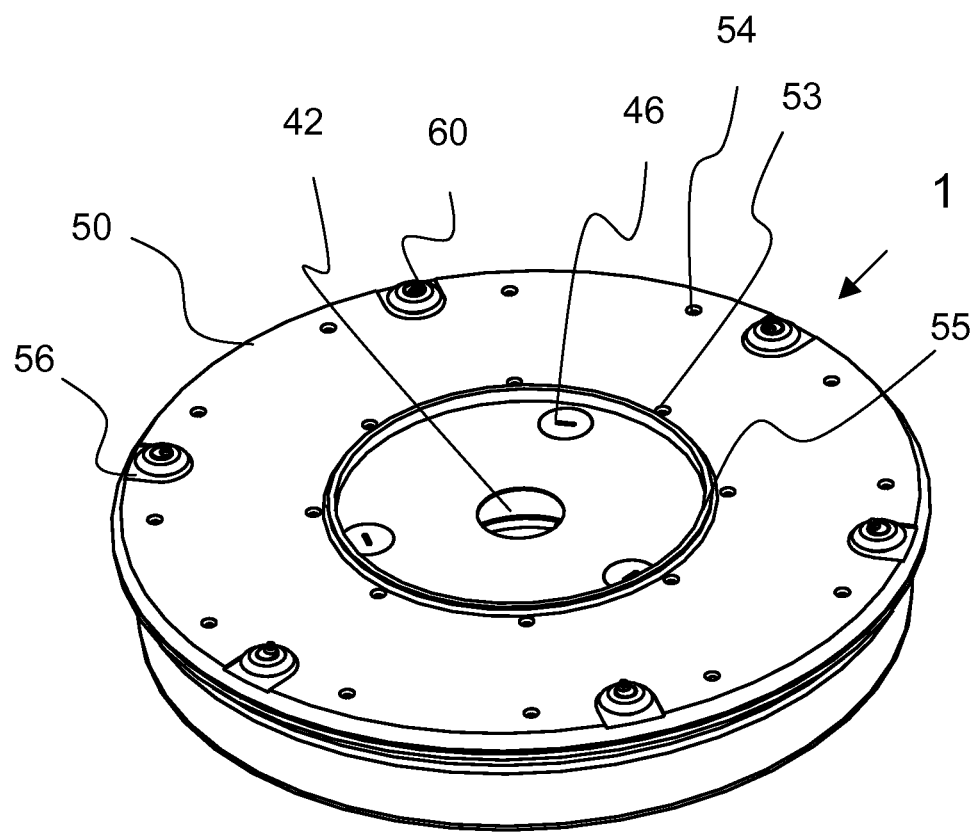
FIG. 1 is a schematic perspective view of a chuck according to the invention.

In FIG. 1, a chuck (1) in accordance with a preferred embodiment of the invention includes a ring-shaped shield plate (50) substantially covering a chuck body, which will be described in more detail below with reference to FIGS. 2 and 3. The shield plate (50) includes a plurality of through-holes (52) essentially uniformly spaced about a peripheral region of the plate, through which corresponding gripping pins (60) extend upwardly from the chuck body to a predetermined height above the shield plate (50). A recess (56) formed in and extending to a peripheral edge of the shield plate (50) surrounds each pin (60), such that fluid dropping from pins (60), and especially from the pin covers (63) discussed below, may be captured and directed outwardly away from chuck (1).

Shield plate (50) also includes an upwardly extending flange (55) circumnavigating a central aperture of the shield plate (50). Preferably, as shown in FIG. 2, flange (55) forms a peripheral edge of the central aperture of shield plate (50). Shield plate (50) concentrically surrounds a through-hole (42) formed in the chuck body, as will be described in more detail below with reference to FIG. 2.

In use, pins (60) operatively engage a peripheral edge of a wafer (not shown) such that the wafer is fixedly located a predetermined distance above and parallel to the shield plate (50), and preferably at a predetermined distance above the flange (55) of the shield plate (50). Accordingly, one or more treatment fluids, including elevated temperature fluids, may be dispensed onto an upper surface of the wafer that faces away from the chuck (1) and optionally also onto an opposing lower surface of the wafer via through-hole (42). Chuck (1) may be rotatably mounted on a drive mechanism (not shown) so as to be rotatable about its central axis, as is described for example in U.S. Pat. Nos. 4,903,717, 5,513,668 and 6,536,454.

Shield plate (50) substantially covers the chuck body, the various components of which will now be described with reference to the embodiments of the present invention depicted in FIGS. 2 and 3.

Figure 2:
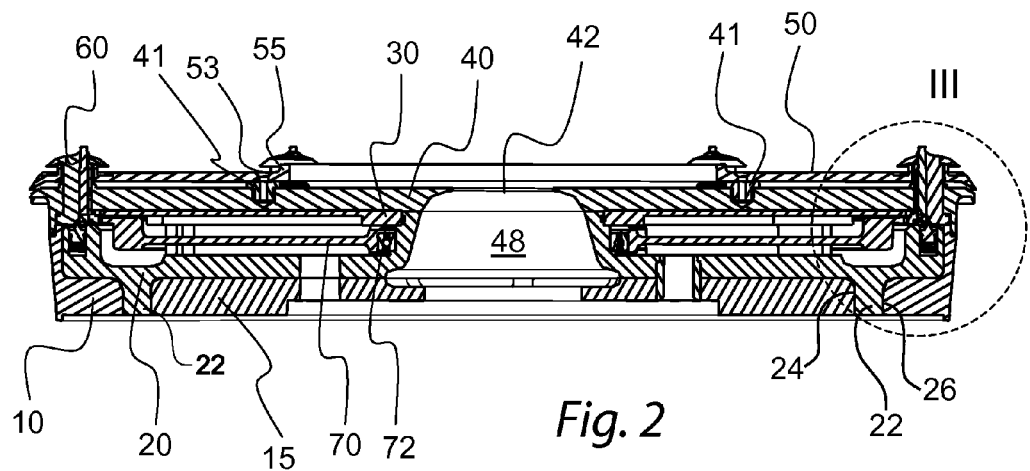
FIG. 2 is a axial cross-sectional view of the chuck of FIG. 1.

In FIG. 2, chuck (1) comprises at its lower portion a base body (20) approximately in the shape of an annular cup surrounding a central aperture. Each of the inner and outer peripheries of base body (20) is formed as an upwardly extending peripheral edge, whereby the upper surface of base body (20) forms an upwardly facing annular concavity. Base body (20) further includes on its lower surface a downwardly extending annular ridge (22) so as to form a downwardly facing central recess (24) located within the annular ridge and a downwardly facing annular recess (26) located radially outside of the annular ridge.

An essentially planar inner base ring (15) having a central aperture is seated within the downwardly facing central recess (24) of base body (20) and is attached to base body (20). An outer base ring (10) is located within the downwardly facing annular recess (26) of base body (20) and further extends upwardly along the outer surface of the upwardly extending outer peripheral edge of base body (20). Outer base ring (10) is attached to base body (20).

An essentially planar upper body part (40) having a central through-hole (42) has a lower surface that coextensively overlies base body (20) so as to adjoin both the inner and outer upwardly extending peripheral edges of base body (20). Thus, upper part (40) encloses the upwardly facing annular concavity of base body (20) so as to form an annular space therebetween.

A plurality of through-holes essentially uniformly spaced about an outward circumference of the upper part (40) align with the corresponding plurality of through-holes of shield plate (50), so as to mutually accommodate the plurality upwardly of extending pins (60).

Figure 3:
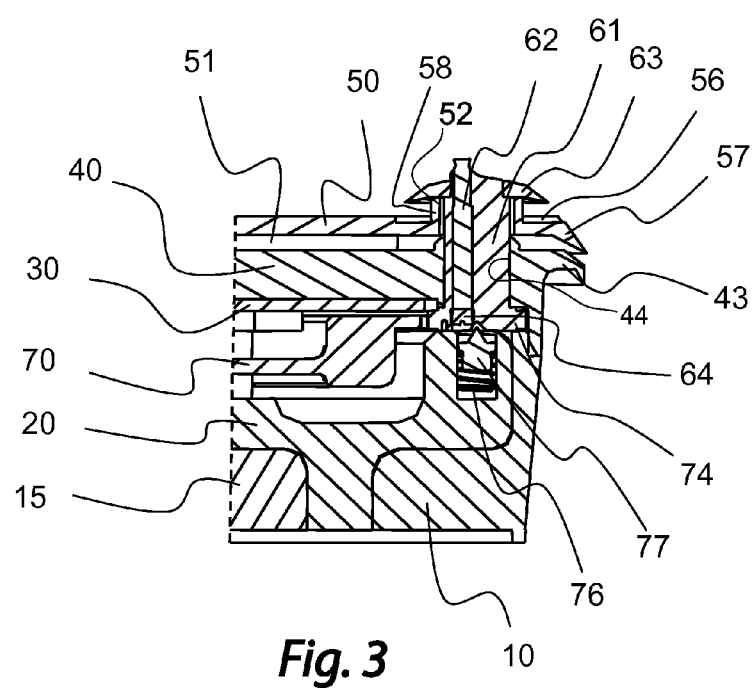
FIG. 3 is an enlarged view of the detail III of FIG. 2.

Upper part (40) further includes at its upper and outer peripheral edge an outwardly and downwardly extending flange (43), as shown in FIG. 3. Upper part (40) preferably is formed of polyvinylidene fluoride (PVDF).

As shown in FIG. 2, the central apertures of inner base ring (15) and base body (20) cooperatively align to enclose a central space (48), which space (48) cooperatively aligns with through-hole (42) of upper part (40) to create a through-passage extending through the entire cross-section of chuck (1). Accordingly, a non-rotating nozzle head (not shown) may be positioned within the space (48) so that liquid and/or gas can be dispensed to an underside of a wafer via through-hole (42).

Shield plate (50) essentially coextends above upper part (40) and covers the upper surface of upper part (40) by more than about 50%, preferably more than about 75%, and up to 100%, such that in use shield plate (50) physically and thermally shields upper part (40) from elevated temperature processing fluids. Shield plate (50) includes at its peripheral edge an outwardly and downwardly extending flange (57) that coextensively overlies the outwardly and downwardly extending flange (43) of upper part (40), as shown in FIG. 3.

Shield plate (50) and upper part (40) can be formed of the same or different materials. Shield plate (50) preferably is formed of polyvinylidene fluoride (PVDF).

Again referring to the embodiments of the invention depicted in FIGS. 2 and 3, shield plate (50) is maintained at a predetermined uniform distance above upper part (40) so as to form a gap (51) therebetween. Shield plate (50) can be secured to upper part (40) in any manner suitable for providing gap (51). For example, mounting screws (53, 54) extending through corresponding mounting screw holes (52) in shield plate (50) and into an upper surface of upper part (40) can be fitted with distance sleeves (41) functioning as uniform spacers between shield plate (50) and upper part (40). Such mounting screws (53, 54) and associated distance sleeves (41) preferably are provided at essentially equidistant spacing about an inner and an outer circumference of the chuck (1), as shown in FIG. 1.

Gap (51), which may be filled with air or other fluid, further shields upper part (40) from unwanted thermal effects of elevated temperature processing fluids during use. The desired height of gap (51) corresponding to the uniform distance between shield plate (50) and upper part (40) may be determined based upon the expected processing fluid temperatures and the thermodynamic properties of shield plate (50). Preferably gap (51) is about 3 mm. More preferably, shield plate (50) and gap (51) are cooperatively configured such that in use upper part (40) experiences a temperature of not more than about 80° C. even when the temperature of the wafer being processed is substantially higher, for example 120° C. or higher, and as high as 180° C.

In FIGS. 2 and 3, chuck (1) further includes an annular reinforcing plate (30) located between upper part (40) and base body (20). In particular, reinforcing plate (30) adjoins the lower surface of upper part (40) and may be attached thereto by screws (46) (shown in FIG. 1). Reinforcing plate (30) extends from the upwardly extending inner peripheral edge of base body (20) to approximately the upwardly extending outer peripheral edge of base body (20), so as to be approximately coextensive with the annular space formed between the upper part (40) and base body (20).

Reinforcing plate (30) at least in part functions to inhibit or prevent deformation of base body (20) and/or upper part (40) due to elevated wafer processing temperatures. Accordingly, reinforcing plate (30) may be formed of any thermally and structurally suitable material, and is preferably aluminum.

As is best shown in FIG. 3, each of pins (60) comprises a pin base body (61) seated within mating through-holes (44) of upper part (40) and (52) of shield plate (50). Pin base body (61) extends upwardly a predetermined distance above shield plate (50) and is capped at its upper end by an outwardly and downwardly extending pin cover (63).

A pin rod (62) seated within an eccentrically located longitudinal through-hole in pin base body (61) extends upwardly a predetermined distance above pin cover (63) and is circumscribed at approximately its upper end by a groove which is configured for contacting and securing an edge of a wafer in the radial and axial directions. Pin rod (62) is affixed within the through-hole of pin base body (61) by a set screw (64). Preferably, pin rod (62) is formed of ceramics or sapphire.

A lower end of pin base body (61) is formed by an enlarged diameter pin gear part (74) seated within a mating shoulder formed in upper part (40). Each pin base body (61) is urged upwardly toward upper part (40) by a needle bearing (77) and associated helical spring (76), each of which is located within a recess formed within the outer upwardly extending peripheral edge of base body (20).

Pin cover (63) thus shields pin base body (61) and pin gear part (64) from processing fluids by directing any fluid that would otherwise impinge on the pin body (61) outwardly and away from the pin (60) toward recess (56) in shield plate (50). Moreover, shield plate (50) includes an annular flange (58) surrounding each pin (60), and extending from the top surface of shield plate (50) to a bottom surface of pin cover (63), such that pins (60) are further shielded both physically and thermally from elevated temperature processing fluids.

An essentially planar gear ring (70) is seated within the annular space formed between upper part (40) and base body (20). At its outer peripheral edge, gear ring (70) includes radially outwardly extending teeth which mesh with corresponding teeth that radially outwardly extend from pin gear part (74). At its inner peripheral edge, gear ring (70) is rotatably seated against the inner upwardly extending peripheral edge of base body (20) via a ball bearing (72).

Gear ring (70) is configured and located so as to be rotatable relative to base body (20) such that upon rotation of gear ring (70) the pin gear part (74) is caused to rotate about its central axis. Consequently, each eccentrically located pin rod (62) is caused to rotate between an outer "open" position in which a wafer may be released and an inner "closed" position in which a wafer is radially and axially secured by pins (60). Mechanisms for providing relative movement of a gear wheel and a chuck body so as to rotate eccentrically located pins are known as described for example in U.S. Pat. Nos. 4,903,717 and 5,513,668.

As will be apparent to a person of ordinary skill upon reading the present disclosure, a chuck in accordance with the present invention provides a plurality of shielding members, each of which is capable of reducing degradation or deformation of chuck components due to contacting a wafer or other article with elevated temperature treatment fluids.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. A chuck for supporting a wafer-shaped article comprising:
   a body adapted to position a wafer-shaped article in a predetermined orientation during a processing operation, said body comprising an upper surface and a plurality of pins extending upwardly relative to said upper surface, said pins being configured for engaging an edge or surface of a wafer-shaped article; and at least one shielding member positioned over at least one of said upper surface of said body and a portion of at least one of said pins located upwardly of said upper surface, wherein said at least one shielding member comprises a shield plate positioned substantially over said upper surface of said body and maintained at a predetermined distance above said upper surface of said body so as to form a gap therebetween.

2. A chuck for supporting a wafer-shaped article comprising:

a body adapted to position a wafer-shaped article in a predetermined orientation during a processing operation, said body comprising an upper surface and a plurality of pins extending upwardly relative to said upper surface, said pins being configured for engaging an edge or surface of a wafer-shaped article; and at least one shielding member positioned over at least one of said upper surface of said body and a portion of at least one of said pins located upwardly of said upper surface, wherein said at least one shielding member comprises a shield plate having a plurality of through-holes, each of said pins extending through one of said plurality of through-holes, said shield plate further comprising recesses surrounding each of said through holes and configured to collect processing liquid and direct processing liquid radially outwardly away from said body.

3. The chuck according to claim 2, wherein said shield plate further comprises an annular flange surrounding each of said plurality of pins.

4. The chuck according to claim 2, wherein said shield plate further comprises a central opening and an upwardly extending annular flange surrounding the central opening.

5. The chuck according to claim 2, wherein said at least one shielding member further comprises one or more pin covers.

6. The chuck according to claim 5, wherein each said pin cover overlies a pin body and defines an opening through which a pin rod passes, said pin cover extending radially outwardly and downwardly relative to a longitudinal axis of said pin base body and being positioned relative to said recesses so as to direct processing liquid from an upper surface of said pin cover to an underlying recess.

7. A chuck for supporting a wafer-shaped article comprising:

a body adapted to position a wafer-shaped article in a predetermined orientation during a processing operation, said body comprising an upper surface and a plurality of pins extending upwardly relative to said upper surface, said pins being configured for engaging an edge or surface of a wafer-shaped article; and at least one shielding member positioned over at least one of said upper surface of said body and a portion of at least one of said pins located upwardly of said upper surface, further comprising a metallic reinforcing member positioned beneath an upper part of said body.

8. A chuck for supporting a wafer-shaped article comprising:

a body adapted to position a wafer-shaped article in a predetermined orientation during a processing operation, said body comprising an upper surface and a plurality of pins extending upwardly relative to said upper surface, said pins being configured for engaging an edge or surface of a wafer-shaped article; and at least one shielding member positioned over at least one of said upper surface of said body and a portion of at least one of said pins located upwardly of said upper surface, wherein said at least one shielding member comprises one or more pin covers.

9. The chuck according to claim 8, wherein each said pin cover overlies a pin body and defines an opening through which a pin rod passes, said pin cover extending radially outwardly and downwardly relative to a longitudinal axis of said pin base body.

10. A chuck for supporting a wafer-shaped article comprising:

a body adapted to position a wafer-shaped article in a predetermined orientation during a processing operation, said body comprising an upper surface and a plurality of pins extending upwardly relative to said upper surface, said pins being configured for engaging an edge or surface of a wafer-shaped article; and at least one shielding member positioned over at least one of said upper surface of said body and a portion of at least one of said pins located upwardly of said upper surface, wherein said at least one shielding member comprises a shield plate, said shield plate comprising recesses surrounding each of said through holes and configured to collect processing liquid and direct processing liquid radially outwardly away from said body.

* * * * *